US006946863B1

(12) United States Patent
Loughmiller et al.

(10) Patent No.: US 6,946,863 B1
(45) Date of Patent: Sep. 20, 2005

(54) CIRCUIT AND METHOD FOR MEASURING AND FORCING AN INTERNAL VOLTAGE OF AN INTEGRATED CIRCUIT

(75) Inventors: Daniel R. Loughmiller, Boise, ID (US); Joseph C. Sher, Boise, ID (US); Kevin G. Duesman, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 645 days.

(21) Appl. No.: 09/633,375

(22) Filed: Aug. 7, 2000

Related U.S. Application Data

(63) Continuation of application No. 09/031,934, filed on Feb. 27, 1998, now Pat. No. 6,117,696.

(51) Int. Cl.[7] .............................................. G01R 31/02
(52) U.S. Cl. ....................................... 324/765; 324/763
(58) Field of Search ................................ 324/765, 763, 324/158.1, 73.1, 72.5; 327/536; 363/59, 60, 61; 326/30; 714/730–733; 438/14, 18, 17; 257/40, 48

(56) References Cited

U.S. PATENT DOCUMENTS

| | | | |
|---|---|---|---|
| 4,490,673 A | 12/1984 | Blum et al. ............. 324/158 R |
| 4,504,784 A | 3/1985 | Goel et al. ................ 324/73 R |
| 4,550,289 A | 10/1985 | Kabashima et al. ..... 324/158 R |
| 4,839,865 A | 6/1989 | Sato et al. .................. 365/201 |
| 4,970,454 A | 11/1990 | Stambaugh et al. ...... 324/73.01 |
| 4,985,672 A | 1/1991 | Hashimoto et al. ......... 324/763 |
| 5,030,904 A | 7/1991 | Tanksalvala et al. .... 324/158 R |
| 5,107,208 A | 4/1992 | Lee .......................... 324/158 R |
| 5,157,629 A | 10/1992 | Sato et al. ................... 365/201 |
| 5,196,787 A | 3/1993 | Ovens et al. ............ 324/158 R |
| 5,253,255 A | 10/1993 | Carbine ...................... 371/22.6 |
| 5,488,426 A | 1/1996 | Pack ........................... 348/569 |
| 5,498,972 A | 3/1996 | Haulin ......................... 324/765 |
| 5,508,631 A | 4/1996 | Manku et al. .............. 324/763 |
| 5,526,312 A | 6/1996 | Eltoukhy ..................... 365/201 |
| 5,581,176 A | 12/1996 | Lee ......................... 324/158.1 |
| 5,627,478 A | 5/1997 | Habersetzer et al. ........ 324/763 |
| 5,642,057 A | 6/1997 | Oke et al. ................... 324/763 |
| 5,648,730 A | 7/1997 | Bhuva et al. ............... 324/763 |
| 5,657,328 A | 8/1997 | Swoboda .................... 371/22.3 |
| 5,739,868 A | 4/1998 | Butler et al. ................ 348/584 |
| 5,744,990 A * | 4/1998 | Burstein et al. ............. 327/143 |
| 5,751,158 A | 5/1998 | Loughmiller ............... 324/763 |
| 5,786,703 A | 7/1998 | Piirainen .................... 324/763 |
| 5,847,552 A | 12/1998 | Brown ........................ 323/281 |
| 5,977,763 A * | 11/1999 | Loughmiller et al. ..... 324/158.1 |
| 5,999,009 A * | 12/1999 | Mitsui ......................... 327/765 |
| 6,060,896 A * | 5/2000 | Ma et al. .................... 327/763 |
| 6,117,696 A * | 9/2000 | Loughmiller et al. ......... 438/17 |
| 6,140,831 A * | 10/2000 | Loughmiller ............... 324/765 |
| 6,229,296 B1 * | 5/2001 | Duesman et al. ........ 324/158.1 |

OTHER PUBLICATIONS

Millman, J., et al., "Integrated Electronics: Analogs and Digital Circuits and Systems", *McGraw–Hill Book Company, Inc.*, 330–331, (1972).

* cited by examiner

Primary Examiner—Kamand Cuneo
Assistant Examiner—Jimmy Nguyen
(74) Attorney, Agent, or Firm—Schwegman, Lundberg, Woessner & Kluth, P.A.

(57) ABSTRACT

A method for passing a voltage between an internal node inside a memory device and an external pin outside the memory device. The method includes passing an internal voltage from the internal node to the external pin during a read mode. The method also includes passing an external voltage from the external pin to the internal node during a force mode.

55 Claims, 5 Drawing Sheets

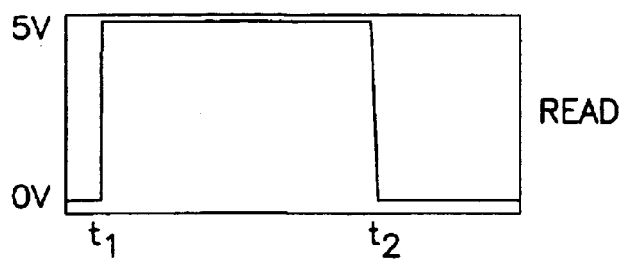
FIG. 3A    READ
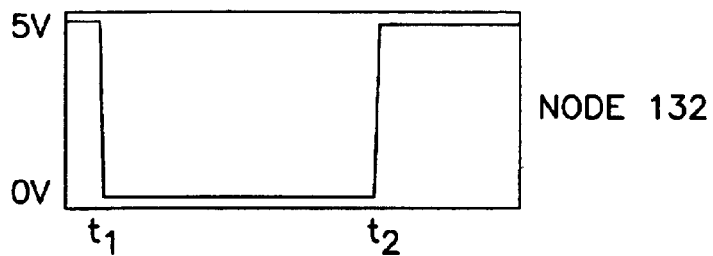
FIG. 3B    NODE 132
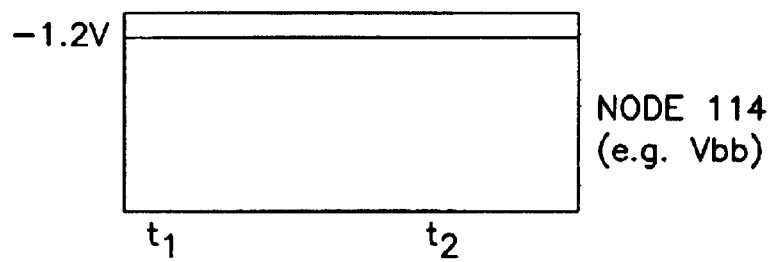
FIG. 3C    NODE 114 (e.g. Vbb)
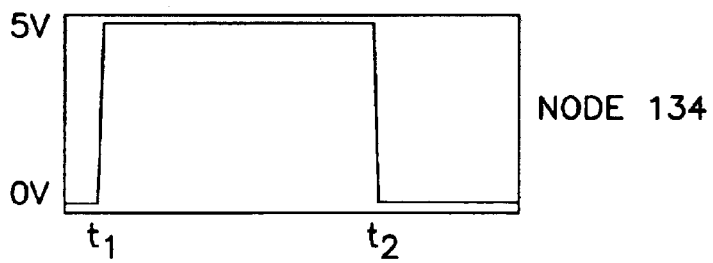
FIG. 3D    NODE 134
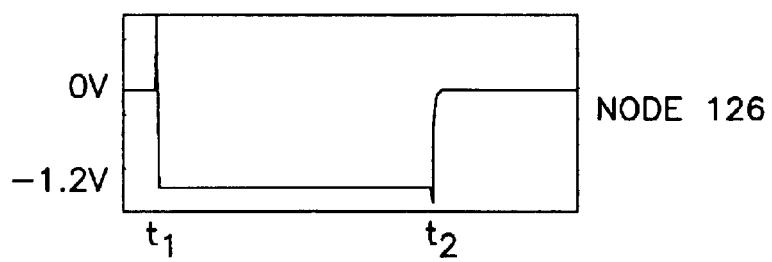
FIG. 3E    NODE 126
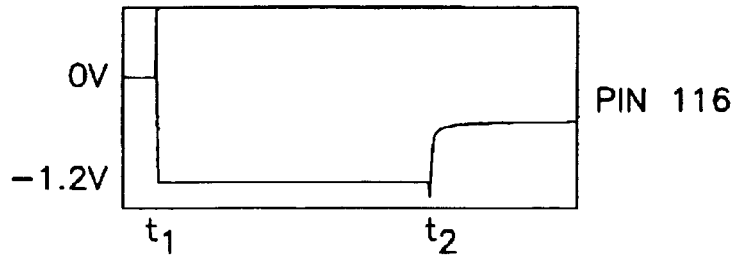
FIG. 3F    PIN 116

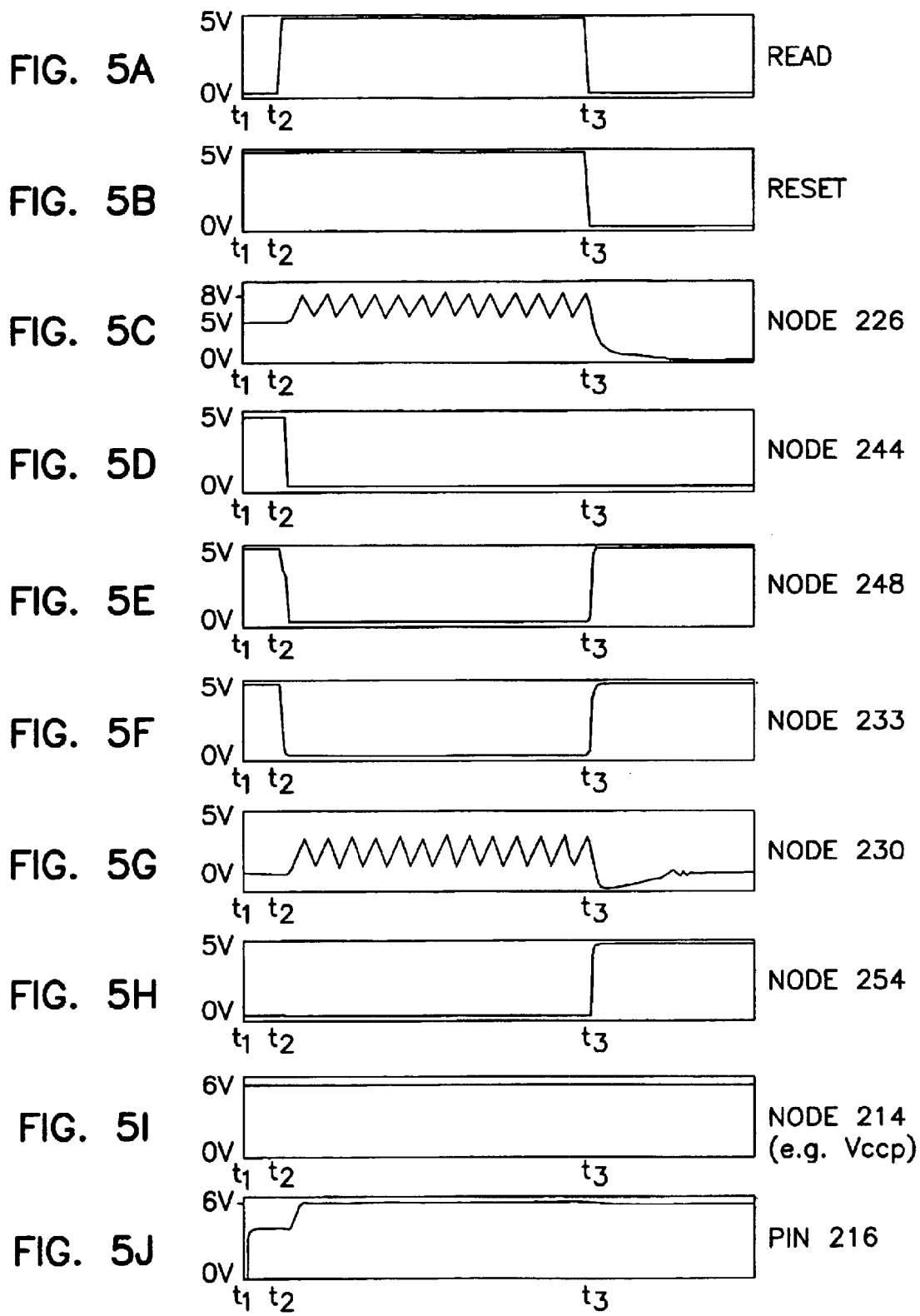

US 6,946,863 B1

CIRCUIT AND METHOD FOR MEASURING AND FORCING AN INTERNAL VOLTAGE OF AN INTEGRATED CIRCUIT

This application is a continuation of U.S. patent application Ser. No. 09/031,934, filed on Feb. 27, 1998 now U.S. Pat. No. 6,117,696 (the '934 Application). The '934 Application is incorporated herein by reference.

TECHNICAL FIELD OF THE INVENTION

The present invention relates generally to electronic circuits and in particular the present invention relates to a circuit and method for measuring and forcing an internal voltage of an integrated circuit.

BACKGROUND OF THE INVENTION

Integrated circuits comprise a collection of transistors and other semiconductor devices interconnected on a semiconductor substrate. During production, an integrated circuit is encapsulated, for example, in a plastic body. Further, a passivation layer comprising silicon dioxide, for example, may be formed on the integrated circuit prior to encapsulation to protect the junctions and surfaces of the semiconductor devices of the integrated circuit from harmful environments. The integrated circuit interfaces with other components of a system via a number of metal pins that extend from the plastic body. The pins provide electrical connection to various internal points or nodes in the integrated circuit. Typically, many internal nodes in the circuit that can impact the performance of the integrated circuit are not connected to a pin.

For example, the substrate voltage is a measurable quantity that can affect the operation of an integrated circuit such as a refresh operation in a dynamic random access memory. However, the substrate voltage is not typically provided at a pin of the integrated circuit. If a problem is suspected with the substrate voltage once the integrated circuit is packaged or passivated, an engineer must remove at least a portion of the plastic casing or passivation layer or both and place a probe at the proper node to determine the voltage. Based on the measurement, process parameters may be adjusted for further production. However, this procedure is time consuming and subject to the accuracy of the set up of the testing equipment.

For the reasons stated above, and for other reasons stated below which will become apparent to those skilled in the art upon reading and understanding the present specification, there is a need in the art for a circuit and method for measuring and forcing an internal voltage in an integrated circuit without having to remove either the plastic body or the passivation layer.

SUMMARY OF THE INVENTION

The above mentioned, problems with measuring internal voltages in an integrated circuit and other problems are addressed by the present invention and which will be understood by reading and studying the following specification. A circuit is described which measures voltages at internal nodes of an integrated circuit without removing a plastic body or a passivation layer.

In particular, the present invention describes a circuit for reading a voltage at a node of an integrated circuit. The circuit comprises a pass circuit that has an input coupled to the node of the integrated circuit. The circuit provides a measurement of the voltage at the node as an output to a pin. A reset circuit is coupled to the pass circuit and is operable to activate and reset the pass circuit. Finally, a pass control circuit is coupled to provide an output signal to the pass circuit that drives the pass circuit when active to pass the voltage at the node to the pin. The circuit can also force the voltage at the node of the integrated circuit by applying a voltage to the pin.

BRIEF DESCRIPTION OF THE DRAWINGS

FIGS. 3A through 3F are timing diagrams illustrating the operation of the embodiment of FIG. 2;

FIG. 5A through 5J are timing diagrams illustrating the operation of the embodiment of FIG. 4.

DETAILED DESCRIPTION OF THE INVENTION

In the following detailed description of the illustrative embodiments, reference is made to the accompanying drawings which form a part hereof, and in which is shown by way of illustration specific illustrative embodiments in which the invention may be practiced., These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a to limiting sense.

Figure 1:
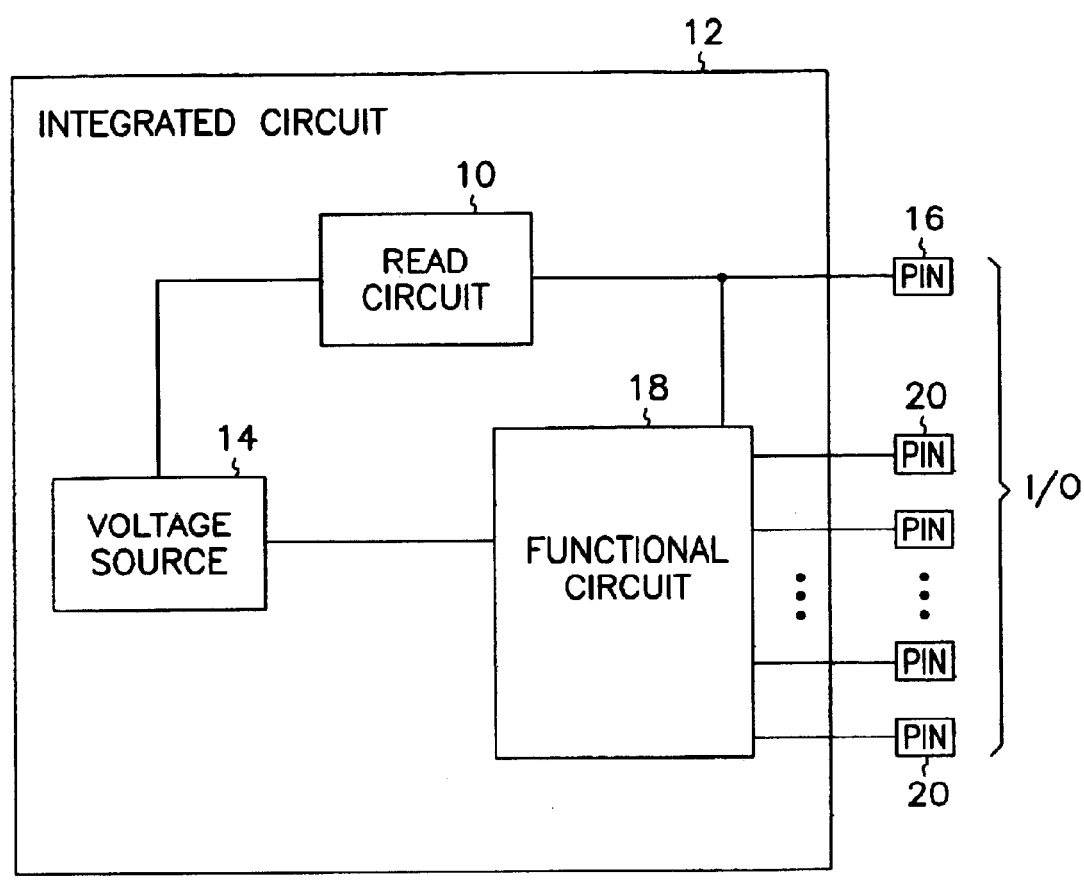
FIG. 1 is a block diagram of an embodiment of the present invention.

FIG. 1 is a block diagram of an illustrative embodiment of the present invention. Read circuit 10 is formed as a part of integrated circuit 12 on the same substrate with voltage source 14 and functional circuit 18. Although voltage source 14, read circuit 10 and functional circuit 18 are shown in separate locations of integrated circuit 12 in the embodiment of FIG. 1, in other embodiments, components of read circuit 10 and voltage source 14 are intermingled with components of functional circuit 18 to conserve surface area on the substrate of integrated circuit 12 using techniques that are well known in the art. Voltage source 14 is coupled to functional circuit 18 and to read circuit 10. Functional circuit 18 is coupled to input/output pins 16 and 20. Further, read circuit 10 is also coupled to input/output pin 16. Functional circuit 18 may comprise, for example, a microprocessor, a memory device such as a dynamic random access memory, or a static random access memory or other typical integrated circuit. In other embodiments, integrated circuit 12 may also include more than one read circuit coupled to other voltage sources.

Figure 2:
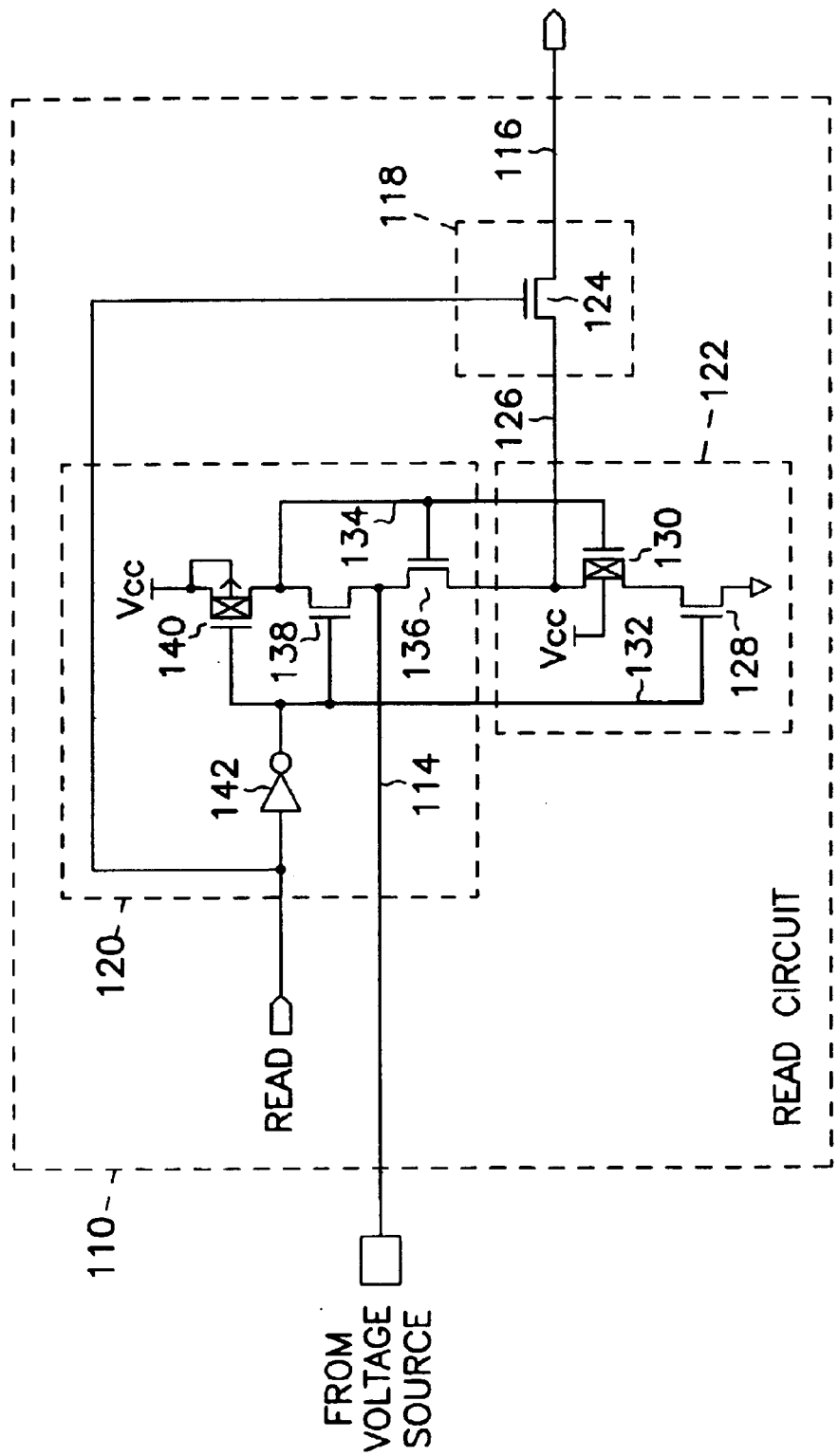
FIG. 2 is a schematic diagram of an embodiment of a read circuit for use in the block diagram of FIG. 1.
Figure 4:
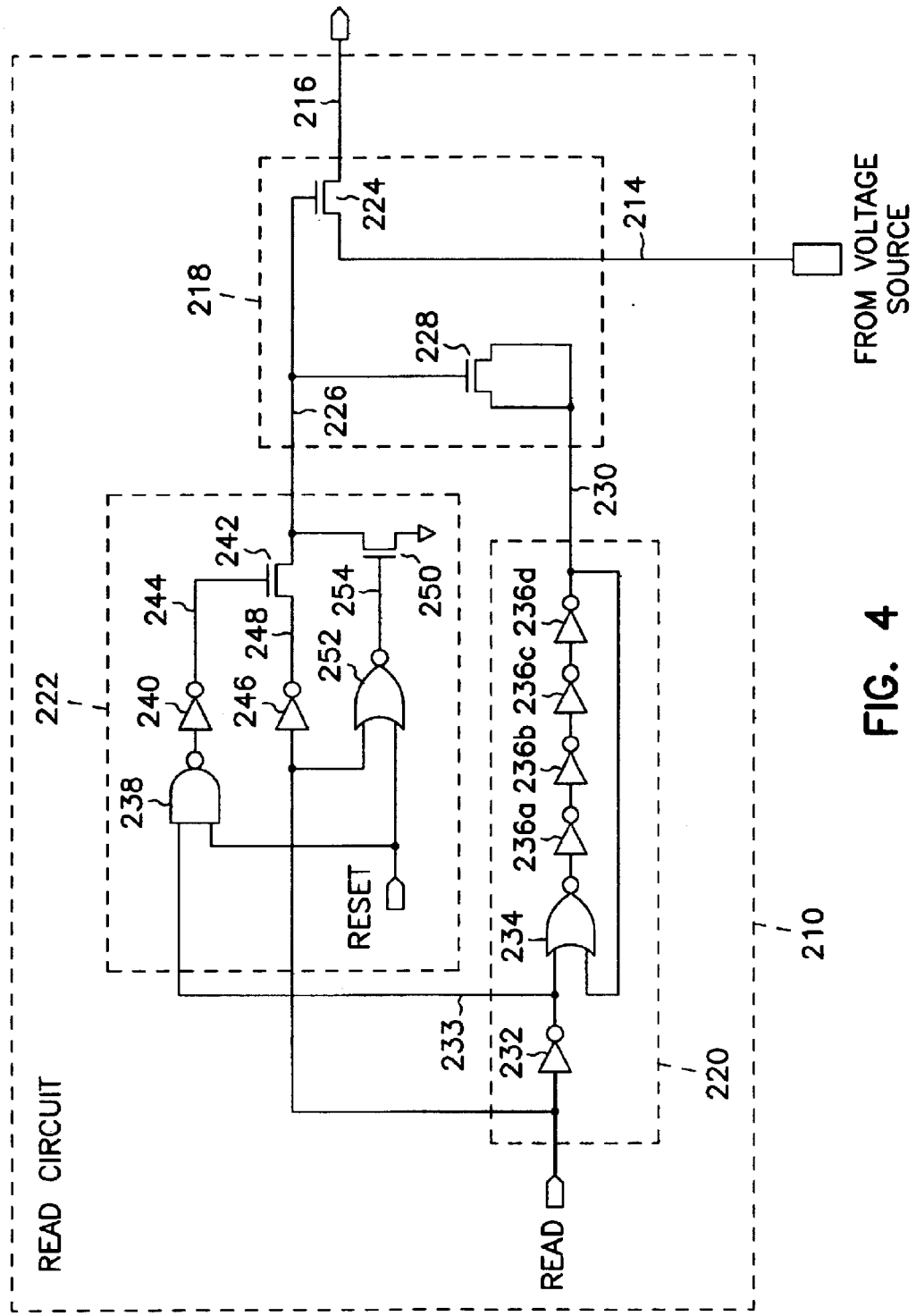
FIG. 4 is a schematic diagram of another embodiment of a read circuit for use with the block diagram of FIG. 1.

In operation, read circuit 10 is operable to provide two functions. First, read circuit 10 can measure a voltage output by voltage source 14 and pass this voltage to input/output pin 16. This is referred to as "read mode." Alternatively, read circuit 10 can receive a voltage at input/output pin 16 and force the voltage of voltage source 14 to a desired level. This is referred to as "force mode." Read circuit 10 also may be isolated from input/output pin 16 so as to allow functional circuit 18 to use input/output pin 16. The circuits of FIGS. 2 and 4 illustrate embodiments of read circuit 10 and the read mode of each is described below. The circuits are not limited to just reading a voltage. The circuits also operate in a "force mode." A person of ordinary skill in the art will understand that the circuits enter force mode by providing an input voltage at the pin of integrated circuit 12 and then operating the circuit in the same manner as described for read mode.

FIG. 2 is a block diagram of a read circuit, indicated generally at 110, that reads a voltage in integrated circuit 12. Advantageously, circuit 110 measures and forces negative voltages such as a substrate voltage, $V_{bb}$, at node 114 using pin 116. In further embodiments node 114 is coupled to other appropriate points or nodes in integrated circuit 12 which are not normally coupled directly to an input/output pin 20 of integrated circuit 12.

Circuit 110 comprises three main components delineated by broken lines surrounding electrical circuitry: pass circuit 118, pass control circuit 120 and reset circuit 122. Pass circuit 118 comprises n-channel MOS transistor 124 that is coupled to pass the voltage at node 114 to output pin 116 in response to signals from reset circuit 122 and pass control circuit 120. A gate of transistor 124 is coupled to receive a control signal from pass control circuit 120. A source of transistor 124 is coupled to output pin 116 and a drain of transistor 124 is coupled to node 126.

Reset circuit 122 comprises n-channel MOS transistor 128 and p-channel MOS transistor 130 that area coupled to prevent pass circuit from passing a voltage to pin 116 in response to signals from pass control circuit 120. Transistor 128 includes a source that is coupled to ground potential. Further, a gate of transistor 128 is coupled to node 132. A drain of transistor 130 is coupled to a drain of transistor 128. A source of transistor 130 is coupled to node 126 and a gate of transistor 130 is coupled to node 134. Finally, a substrate of transistor 130 is coupled to power supply voltage, $V_{CC}$.

Pass control circuit 120 produces control signals to activate pass circuit 118 to pass a voltage to output pin 116. Pass control circuit 120 comprises first and second n-channel MOS transistors 136 and 138, p-channel transistor 140, and inverter 142. Inverter 142 is coupled between an input signal, labeled READ, from a test signal generator on integrated circuit 12 and node 132. The READ signal is also provided to pass circuit 18 at the gate of transistor 124. A gate of transistor 140 and a gate of transistor 138 are coupled to node 132. A source and substrate of transistor 140 are coupled to the supply voltage, $V_{CC}$. A drain of transistor 140, a drain of transistor 138 and a gate of transistor 136 are coupled together at node 134. A source of transistor 136 is coupled to node 126. Finally, a source of transistor 138 is coupled to a drain of transistor 136 at node 114. Node 114 also receives the voltage to be read by circuit 110.

In operation, circuit 110 passes the voltage at node 114 to output pin 116. FIGS. 3A through 3F are timing diagrams that show voltage levels of identified nodes in circuit 110 as a function of time. At time $t_1$, the READ signal is brought to a high logic level such as 5 volts, for example. In response, transistor 124 turns "on". Further, inverter 142 forces node 132 to ground potential thus turning "off" transistors 128 and 138 and turning on transistor 140. It is noted that a transistor is "on" if a voltage is applied to the gate that creates a conduction channel between source and drain of the transistor. Otherwise, the transistor is said to be "off." With transistor 140 on, node 134 reaches the supply voltage, $V_{CC}$, which turns on transistor 136. Thus, the voltage at node 114 is passed to node 126 by transistor 136 and from node 126 to output pin 116 by transistor 124. It is noted that the voltage at node 134 also turns off transistor 130 and assures that there will be no leakage path through transistors 128 and 130.

Circuit 110 also allows pass circuit 118 to be deactivated and isolated from pin 116. At time $t_2$, the READ signal is brought to a low logic level of approximately zero volts thus turning off pass gate 124. Inverter 142 forces node 132 to a high logic level which turns off transistor 140 and turns on transistors 128 and 138. Further, transistor 138 forces node 134 to the level of the voltage at node 114, e.g. $V_{bb}$, which may be on the order of −1 volts. The negative voltage at node 134 further turns on transistor 130 and turns off transistor 136. Since transistor 136 is off, transistors 128 and 136 can pull node 126 to ground without fighting transistor 136 thus isolating circuit 110 from output pin 116.

FIG. 4 is a block diagram of a read circuit, indicated generally at 210, that reads a voltage in integrated circuit 12 at node 214. Advantageously, circuit 210 reads a high positive voltage such as, for example, the voltage $V_{CCP}$. Circuit 210 comprises three main components: pass circuit 218, pass control circuit 220 and reset circuit 222. Pass circuit 218 comprises n-channel transistor 224 coupled to pass a voltage from node 214 to output pin 216. A gate of transistor 224 is coupled to node 226 through which transistor 224 receives control signals from reset circuit 222. Capacitor-coupled transistor 228 is coupled between node 226 and node 230.

Pass control circuit 220 comprises a ring oscillator or other appropriate circuit for creating an oscillating output signal at node 230. For example, pass control circuit 220 comprises inverter 232, NOR-gate 234, and inverters 236a through 236d. Inverter 132 is coupled to a first input of NOR-gate 234 at node 233. Inverters 236a through 236d are coupled in series to an output of NOR-gate 234. An output of inverter 236d is coupled to a second input of NOR-gate 234. The number of inverters used in pass control circuit 220 can be varied as necessary for an application so long as the output of pass control circuit 220 provides an oscillating signal at node 230. Pass control circuit 220 receives a READ signal at an input to inverter 232 to initiate the oscillating output of pass control circuit 220.

Reset circuit 222 is operable to prevent pass circuit 218 from passing a voltage to output pin 216. Reset circuit 222 comprises NAND-gate 238 that receives the inverted READ signal of node 233 at one input and a RESET signal at a second input. The READ and RESET signals are produced by a test signal generator on integrated circuit 12. The output of NAND-gate 238 is coupled to inverter 240. Inverter 240 is coupled to a gate of transistor 242 at node 244. Inverter 246 receives the READ signal at its input and is coupled at the output to a drain of transistor 242 at node 248. A source of transistor 242 is coupled to pass circuit 218 at node 226. A drain of a second transistor 250 is coupled to node 226. A source of transistor 250 is coupled to ground potential. NOR-gate 252 is coupled at its output to a gate of transistor 250 at node 254. The RESET signal is coupled to a first input to NOR-gate 252. A second input to NOR-gate 252 receives the READ signal.

In operation, circuit 210 is operable to read a voltage at node 214 and provide the output at output pin 216. The operation of circuit 210 can be divided into three parts based on the values of the READ and RESET signals.

At time $t_1$ in FIGS. 5A through 5J, the READ signal is set to a low logic level of approximately ground potential and the RESET signal is set to a high logic level of, for example, 5 volts. Inverter 232 sets node 233 at a high logic level such that the output of pass control circuit 220 at node 230 is maintained at a low logic level. In this state, NOR-gate 252 outputs a low logic level at node 254 and thus transistor 250 is turned off. Further, transistor 242 is turned on by a high logic value at node 244 and a high logic value at node 248. Thus, node 226 is precharged to the supply voltage, $V_{CC}$, less the threshold voltage, $V_T$.

At time $t_2$, the voltage at node 214 can be read by bringing the READ signal to a high logic level while maintaining the RESET signal at a high logic level. At this time, node 244 is reduced to a low logic level and transistor 242 is turned off isolating reset circuit 222 from pass circuit 218. Inverter 232 produces a low logic level at node 233 which starts the output of pass control circuit 220 at node 230 to oscillate. As is well known in the art, the charge on a capacitor cannot change instantaneously, so node 226 follows the oscillation of node 230. The peak voltage on node 226 is higher than $V_{CCP}$ by at least one $V_T$, thus the full value of $V_{CCP}$ is passed to pin 216 by transistor 224.

At time $t_3$, pin 216 is isolated from circuit 210. The READ and RESET signals are both taken to ground potential. Node 233 returns to a high logic level and the output of pass control circuit 220 ceases to oscillate at node 230. Further, node 244 stays at ground potential and transistor 242 stays off. Node 254 goes to a high logic level turning on transistor 250 and bringing node 226 to a low logic level so as to turn off transistor 224 and isolate circuit 210 from pin 216. Once isolated, pin 216 is allowed to float and decays over time as shown in FIG. 5J.

CONCLUSION

By incorporating circuit 110, circuit 210 or both onto the same substrate as integrated circuit 12, it is possible to accurately measure or force internal voltages of an integrated circuit without the time consuming process of removing the packaging or passivation layer or both. Thus, engineers can easily monitor the output of a fabrication line and make adjustments as necessary to assure that specifications for the internal voltages are being met. For example, in production of dynamic random access memory (DRAM) device, engineers can monitor both $V_{bb}$ and $V_{CCP}$ to assure compliance with specifications. During a production run, a number of DRAMs are fabricated that include either circuit 110, circuit 210 or an equivalent. The engineer selects at least one of the DRAMs to test the voltage at the node such as $V_{bb}$ or $V_{CCP}$ or both. If the values are not acceptable, the engineer can adjust process parameters to correct the error so that future integrated circuits produced on the line will function properly.

Further, engineers can use circuit 110 or 210 to determine an a acceptable operating voltage for the internal node. First, an integrated circuit is fabricated that includes a functional circuit and the read circuit. The engineer selects a voltage for the internal node and applies the voltage to the pin. The read circuit forces this voltage on the node of the integrated circuit The engineer can then test the functional circuit to assess its operation with the forced voltage on the node. Based on the tests, the engineer can adjust the voltage forced on the node until the functional circuit operates acceptably.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. For example, other circuits that produce an oscillating output may be substituted for the ring oscillator shown in FIG. 3. Further, the type of integrated circuit 12 and the voltage being measured with circuit 110 and 210 may be varied without departing from the spirit and scope of the present invention.

What is claimed is:

1. A method for forcing a voltage at an internal node of an integrated circuit to a desired level, the method comprising:
   coupling a pass circuit between the internal node and a pin of the integrated circuit;
   applying a voltage of the desired level to the pin;
   using a reset circuit to activate the pass circuit; and
   driving the pass circuit to pass the applied voltage from the pin to the internal node, thereby forcing the voltage at the internal node to the desired level.

2. The method of claim 1, further comprising using a pass control circuit to drive the pass circuit.

3. The method of claim 1, wherein the pass control circuit comprises an n-channel MOS transistor having a drain coupled to the internal node, the n-channel MOS transistor configured to, when turned on, pass the voltage at the internal node to a source of the n-channel MOS transistor and to the pass circuit.

4. The method of claim 1, further comprising providing an oscillating control signal to the pass circuit.

5. The method of claim 4, further comprising using a ring oscillator to provide the oscillating control signal to the pass circuit.

6. The method of claim 1, wherein the pass circuit comprises:
   a pass gate having first, second, and third terminals, the first terminal coupled to a pass control circuit, the second terminal coupled to the internal node, the third terminal coupled to the pin; and
   a capacitor coupled between the first terminal of the pass gate and the pass control circuit such that a voltage at the first terminal of the pass gate is driven to cause a voltage at the second terminal voltage to be passed to the third terminal for reading the voltage at the internal node.

7. The method of claim 6, wherein the pass gate comprises an n-channel MOS transistor.

8. A method comprising:
   receiving a read signal;
   coupling a pass circuit between an internal node and a pin of an integrated circuit;
   resetting the pass circuit with a reset circuit based on a first state of the read signal; and
   passing the voltage from the internal node to the pin based on a second state of the read signal.

9. The method of claim 8, wherein passing the voltage from the internal node includes driving a control node connected to the pass circuit to a first voltage based on the second state of the read signal.

10. The method of claim 9, wherein driving includes passing an oscillating signal to the pass circuit.

11. The method of claim 9, wherein resetting the pass circuit includes driving the control node to a second voltage based on the first state of the read signal.

12. The method of claim 11, wherein resetting the pass circuit includes driving the control node to ground.

13. A method comprising:
   receiving a read signal;
   coupling a pass circuit between an internal node and a pin of an integrated circuit;
   applying an applied voltage to the pin;

resetting the pass circuit with a reset circuit based on a first state of the read signal; and passing the applied voltage from the pin to the internal node based a second state of the read signal.

14. The method of claim 13, wherein passing the applied voltage from the pin includes driving a control node connected to the pass circuit to a first voltage based on the second state of the read signal.

15. The method of claim 14, wherein driving includes passing an oscillating signal to the pass circuit.

16. The method of claim 14, wherein resetting the pass circuit includes driving the control node to a second voltage based on the first state of the read signal.

17. The method of claim 16, wherein resetting the pass circuit includes driving the control node to ground.

18. A method comprising:

receiving a read signal;

passing a voltage between an internal node and an access pin based on a first signal level of the read signal; and signal isolating the access pin from the internal node based on a second signal level of the read signal.

19. The method of claim 18, wherein passing a voltage includes pulling a control voltage of a control node to a first voltage level based on the first signal level of the read signal.

20. The method of claim 19, wherein isolating the access pin includes pulling a control voltage of a control node to a second voltage level based on the second signal level of the read signal.

21. The method of claim 18, wherein passing a voltage includes:

activating a control device connecting between the internal node and a pass node; and activating a pass device connecting between the pass node and the access pin.

22. The method of claim 21, wherein isolating the access pin includes deactivating the pass device.

23. The method of claim 22, wherein isolating the access pin includes deactivating the control device.

24. The method of claim 23, wherein isolating the access pin includes connecting the pass node to ground.

25. The method of claim 18, wherein isolating the access pin includes disabling a pass circuit connected between the access pin and the internal node.

26. The method of claim 18, wherein isolating the access pin includes disconnecting a pass circuit connected to the access pin from a pass control circuit connected to the internal node.

27. The method of claim 18, wherein isolating the access pin includes disconnecting a first terminal of a pass device connected to the access pin from a second terminal of the pass device connected to the internal node.

28. The method of claim 18, wherein isolating the access pin includes cutting off a conduction channel between a source of a pass transistor connected to the access pin and a drain of the pass transistor.

29. A method comprising:

receiving a read signal;

passing an internal voltage from an internal node to an access pin based on a first signal level of the read signal; and isolating the access pin from the internal node based on a second signal level of the read signal.

30. The method of claim 29, wherein passing an internal voltage includes:

passing the internal voltage to a pass node; and passing the internal voltage from the pass node to the access pin.

31. The method of claim 30, wherein:

passing the internal voltage to a pass node is performed by a pass control circuit connecting between the internal node and the pass node; and passing the internal voltage from the pass node to the access is performed by a pass circuit connecting between the pass node and the access pin.

32. The method of claim 30, wherein isolating the access pin includes pulling a voltage of the pass node to ground.

33. The method of claim 29, wherein passing an internal voltage includes:

activating a control device connecting between the internal node and a pass node; and activating a pass device connecting between the pass node and the access pin.

34. The method of claim 33, wherein isolating the access pin includes deactivating the pass device.

35. The method of claim 34, wherein isolating the access pin includes deactivating the control device.

36. The method of claim 35, wherein isolating the access pin includes connecting the pass node to ground.

37. A method comprising:

receiving a read signal;

passing a pin voltage from an access pin to an internal node based on a first signal level of the read signal; and isolating the access pin from the internal node based on a second signal level of the read signal.

38. The method of claim 37, wherein passing a pin voltage includes:

turning on a control transistor connecting between the internal node and a pass node; and turning on a pass transistor connecting between the pass node and the access pin.

39. The method of claim 38, wherein isolating the access pin includes turning off the pass transistor.

40. The method of claim 39, wherein isolating the access pin includes turning off the control transistor.

41. The method of claim 40, wherein isolating the access pin includes connecting the pass node to ground.

42. A method comprising:

receiving a read signal;

activating a control device during a first signal level of the read signal to pass a voltage between an internal node inside a memory device and a pass node inside the memory device;

activating a pass device during the first signal level of the read signal to pass the voltage between the pass node and an input/output pin of the memory device;

deactivating a reset circuit during the first signal level of the read signal to isolate the pass node from ground;

deactivating the control device during a second signal level of the read signal;

deactivating the pass device during the second signal level of the read signal; and activating the reset circuit during the second signal level of the read signal to connect the pass node to ground.

43. The method of claim 42, wherein activating a control device during a first signal level of the read signal to pass a voltage between an internal node inside a memory device and a pass node inside the memory device includes:

passing an internal voltage from the internal node to the pass node.

44. The method of claim 43, wherein activating a pass device during the first signal level of the read signal to pass the voltage between the pass node and an input/output pin of the memory device includes:
passing the internal voltage from the pass node to the input/output pin.

45. The method of claim 44, wherein activating a control device during a first signal level of the read signal to pass a voltage between an internal node inside a memory device and a pass node inside the memory device includes:
passing an applied voltage from the pass node to the internal node.

46. The method of claim 45, wherein activating a pass device during the first signal level of the read signal to pass the voltage between the pass node and an input/output pin of the memory device includes:
passing the applied voltage from the input/output pin to the pass node.

47. A method for measuring a voltage at an internal node of an integrated circuit, the method comprising:
coupling a pass circuit between the internal node and a pin of the integrated circuit;
using a reset circuit to activate the pass circuit; and
driving the pass circuit to pass the voltage from the internal node to the pin.

48. The method of claim 47, further comprising using a pass control circuit to drive the pass circuit.

49. The method of claim 48, further comprising using the pass control circuit to provide at least one output signal to selectively drive the pass circuit to pass a voltage from the internal node to the pin, thereby allowing the voltage at the internal node to be read after the integrated circuit is packaged.

50. The method of claim 48, wherein the pass control circuit comprises an n-channel MOS transistor having a drain coupled to the internal node, the n-channel MOS transistor configured to, when turned on, pass the voltage at the internal node to a source of the n-channel MOS transistor and to the pass circuit.

51. The method of claim 47, further comprising providing an oscillating control signal to the pass circuit.

52. The method of claim 51, further comprising using a ring oscillator to provide the oscillating control signal to the pass circuit.

53. The method of claim 47, further comprising using a pass control circuit to apply a desired voltage to the internal node, thereby forcing the voltage at the internal node to the desired voltage.

54. The method of claim 47, wherein the pass circuit comprises:
a pass gate having first, second, and third terminals, the first terminal coupled to a pass control circuit, the second terminal coupled to the internal node, the third terminal coupled to the pin; and
a capacitor coupled between the first terminal of the pass gate and the pass control circuit such that a voltage at the first terminal of the pass gate is driven to cause a voltage at the second terminal voltage to be passed to the third terminal for reading the voltage at the internal node.

55. The method of claim 54, wherein the pass gate comprises an n-channel MOS transistor.

* * * * *

UNITED STATES PATENT AND TRADEMARK OFFICE
CERTIFICATE OF CORRECTION

PATENT NO. : 6,946,863 B1
DATED : September 20, 2005
INVENTOR(S) : Loughmiller et al.

It is certified that error appears in the above-identified patent and that said Letters Patent is hereby corrected as shown below:

Title page,
Item [56], References Cited, U.S. PATENT DOCUMENTS, delete "324/73.01" and insert -- 324/73.1 -- also delete "327/763" and insert -- 324/763 --.

Column 1,
Line 56, after "mentioned" delete ",".

Column 2,
Line 29, after "practiced." delete ",".
Line 34, after "a" delete "to".

Column 3,
Line 26, delete "area" and insert -- are --.
Line 27, after "circuit" insert -- 118 --.
Line 43, delete "18" and insert -- 118 --.

Column 4,
Line 12, after "128 and" delete "136" and insert -- 130 --.

Column 5,
Line 51, after "an" delete "a".
Line 56, insert -- . -- before "The".

Column 7,
Line 20, delete "signal" before "isolating".

Signed and Sealed this

Twenty-first Day of February, 2006

JON W. DUDAS
*Director of the United States Patent and Trademark Office*